US009913032B2

(12) United States Patent
Barratt

(10) Patent No.: US 9,913,032 B2
(45) Date of Patent: Mar. 6, 2018

(54) AUDIO FILTERING WITH VIRTUAL SAMPLE RATE INCREASES

(71) Applicant: Lachlan Paul Barratt, Summer Hill (AU)

(72) Inventor: Lachlan Paul Barratt, Summer Hill (AU)

(*) Notice: Subject to any disclaimer, the term of this patent is extended or adjusted under 35 U.S.C. 154(b) by 21 days.

(21) Appl. No.: 14/780,398

(22) PCT Filed: Mar. 26, 2014

(86) PCT No.: PCT/AU2014/000319
§ 371 (c)(1),
(2) Date: Sep. 25, 2015

(87) PCT Pub. No.: WO2014/153606
PCT Pub. Date: Oct. 2, 2014

(65) Prior Publication Data
US 2016/0057536 A1    Feb. 25, 2016

Related U.S. Application Data

(60) Provisional application No. 61/903,225, filed on Nov. 12, 2013, provisional application No. 61/819,630, (Continued)

(51) Int. Cl.
*G06F 17/00* (2006.01)
*H04R 3/04* (2006.01)
(Continued)

(52) U.S. Cl.
CPC .............. *H04R 3/04* (2013.01); *G06F 3/165* (2013.01); *G06T 5/00* (2013.01); *G10L 21/0332* (2013.01);
(Continued)

(58) Field of Classification Search
CPC ........... H03H 17/0628; H03H 17/0621; H03H 17/0657; H03H 17/0664; H03H 17/0685
See application file for complete search history.

(56) References Cited

U.S. PATENT DOCUMENTS 5,270,481 A    12/1993  Matsunaga et al.
5,422,827 A     6/1995  Niehaus
(Continued)

FOREIGN PATENT DOCUMENTS

EP    0 795 755 A2    9/1997
EP    2 341 621 A2    7/2011

OTHER PUBLICATIONS

Akay et al., "Analyse und Erweiterung eines DPOAE—Gerates zur Messung von Verzerrungsprodukten im menschlichenOhr", Abschlussbericht DSP-Labor WS06/07, vol. 126, Issue 2, Feb. 14, 2006, pp. 1-39.
(Continued)

*Primary Examiner* — Andrew C Flanders
(74) *Attorney, Agent, or Firm* — Maschoff Brennan

(57) ABSTRACT

The present invention relates broadly to a method of digitally filtering an audio signal at a predetermined sample rate by applying a composite audio filter derived at an increase sample rate. The composite audio filter is obtained by combining one audio filter with another audio filter at the increased sample rate. The sample rate of the audio filters may be increased from their predetermined to the increased sample rate using various weighting techniques. The composite filter may provide a frequency response curve with a corner frequency as it approaches the Nyquist frequency whereas the frequency response of a conventional filter (shown in broken line detail) is flat with no effect.

12 Claims, 12 Drawing Sheets

Related U.S. Application Data filed on May 5, 2013, provisional application No. 61/805,406, filed on Mar. 26, 2013, provisional application No. 61/805,466, filed on Mar. 26, 2013, provisional application No. 61/805,469, filed on Mar. 26, 2013, provisional application No. 61/805,449, filed on Mar. 26, 2013, provisional application No. 61/805,463, filed on Mar. 26, 2013, provisional application No. 61/805,432, filed on Mar. 26, 2013.

(51) Int. Cl.
| | | |
|---|---|---|
| *G06F 3/16* | (2006.01) | |
| *H04R 1/22* | (2006.01) | |
| *G10L 21/0332* | (2013.01) | |
| *G06T 5/00* | (2006.01) | |
| *H03H 17/06* | (2006.01) | |
| *H03H 17/02* | (2006.01) | |

(52) U.S. Cl.
CPC .... *H03H 17/0266* (2013.01); *H03H 17/0286* (2013.01); *H04R 1/22* (2013.01); *G06T 2207/20024* (2013.01); *G06T 2207/20172* (2013.01); *H03H 17/0248* (2013.01); *H03H 17/0657* (2013.01)

(56) References Cited

U.S. PATENT DOCUMENTS

| | | | | |
|---|---|---|---|---|
| 5,907,295 | A * | 5/1999 | Lin | H03H 17/0685 341/50 |
| 6,128,539 | A | 10/2000 | Markandey et al. | |
| 6,473,475 | B1 * | 10/2002 | Putzeys | H03H 17/028 341/61 |
| 7,831,001 | B2 * | 11/2010 | Alderson | G10L 19/02 341/123 |
| 7,908,306 | B1 * | 3/2011 | Chieng | H03F 3/217 708/290 |
| 2003/0154224 | A1 | 8/2003 | Jiang et al. | |
| 2003/0161486 | A1 * | 8/2003 | Wu | H04N 21/8106 381/94.4 |
| 2004/0059764 | A1 * | 3/2004 | Takeda | H03H 17/023 708/313 |
| 2004/0223620 | A1 | 11/2004 | Horbach et al. | |
| 2006/0179095 | A1 * | 8/2006 | Lo Muzio | H03H 17/0275 708/300 |
| 2009/0319065 | A1 * | 12/2009 | Risbo | G11B 20/10527 700/94 |
| 2010/0185450 | A1 * | 7/2010 | Huang | H03H 17/0621 704/500 |
| 2011/0145310 | A1 | 6/2011 | Philippe et al. | |
| 2012/0213375 | A1 | 8/2012 | Mahabub et al. | |
| 2013/0051571 | A1 * | 2/2013 | Nagel | G10L 19/0204 381/56 |
| 2016/0277007 | A1 * | 9/2016 | Tangudu | H03H 17/0275 |

OTHER PUBLICATIONS

Beckmann, P., and Stilson, T., "An Efficient Asynchronous Sampling-Rate Conversion Algorithm for Multi-Channel Audio Application", Audio Engineering Society, Convention Paper, Oct. 7-10, 2005, pp. 1-15.

Blok, M., ""Fractional Delay Filter Design for Sample Rate Conversion"", Proceedings of the Federated Conference onComputer Science and Information Systems (FedCSIS), IEEE, Sep. 9, 2012, pp. 701-706.

Chicharo, J. F., and Mehdi, T. K., "A sliding Goertzel algorithm", Signal Processing, vol. 52, Issue 3 , Aug. 1996, pp. 283-297.

Dickens, B., "HowTo: a "Perfect Reconstruction" Graphic Equalizer", Dec. 16, 2007, pp. 1-10.

Franck, A., "Efficient Algorithms for Arbitrary Sample Rate Conversion with Application to Wave Field Synthesis", Universitätsverlag Ilmenau, Nov. 30, 2011, pp. 1-180.

"Goertzel Filterbank to the Implementation of a Nonuniform DFT", Dec. 14, 2010, pp. 1-5.

Kappeler, R., and David Grünert, D., "Sample Rate Converter 192 kHz Stereo Sample Rate Conversion with B-Spline Interpolation", D-ITET, Department of Information Technology and Electrical Engineering IIS, Integrated Systems Laboratory, Mar. 24, 2004, pp. 1-227.

Russell, A., and Beckmann, P.E., "Efficient Arbitrary Sampling Rate Conversion With Recursive Calculation of Coefficients", IEEE Transactions on Signal Processing, vol. 50, Issue 4, Apr. 2002, pp. 854-865.

International Search Report dated Jun. 13, 2014 as received in Application No. PCT/AU2014/000319.

Written Opinion of the International Searching Authority dated Jun. 13, 2014 as received in Application No. PCT/AU2014/000319.

Supplementary European Search Report dated Oct. 25, 2016 as received in Application No. 14774918.8.

\* cited by examiner

AUDIO FILTERING WITH VIRTUAL SAMPLE RATE INCREASES

This application claims priority from U.S. patent application No. 61/805,432 filed on 26 Mar. 2013, the contents of which are to be taken as incorporated herein by this reference. This application is related to and if required claims priority from U.S. patent application nos. 61/805,406, 61/805,466, 61/805,469, 61/805,449 and 61/805,463 all filed on 26 Mar. 2013, the contents of which are to be taken as incorporated herein by these references. This application is also related to and if required claims priority from U.S. patent application No. 61/819,630 filed on 5 May 2013 and U.S. patent application No. 61/903,225 filed on 12 Nov. 2013, the contents of which are to be taken as incorporated herein by these references.

TECHNICAL FIELD

The present invention relates broadly to a method of digitally filtering an audio signal. The invention relates particularly although not exclusively to digitally filtering an audio signal in audio equalisation (EQ). The invention extends to other digital filtering including filtering images and other signals including signals associated with digital communications and processing.

BACKGROUND ART

In digital recording and playback an analog signal representative of audio is converted into a digital signal which lends itself to manipulation and storage. The conversion is performed in an analog to digital converter (ADC). The stored digital signal can be converted back to an analog signal in a digital to analog converter (DAC). The analog signal is played back using conventional audio equipment such as amplifiers and speakers. The digital signal can be manipulated prior to the DAC to improve its quality before playback. This manipulation includes audio EQ where selected parts of the frequency spectrum of the audio are filtered to, for example, compensate for irregularities in the frequency response. The digital signal may also be filtered to resolve problems from its conversion into a digital signal or back to an analog signal.

SUMMARY OF INVENTION

According to a first aspect of the present invention there is provided a method of digitally filtering an audio signal, said method comprising the steps of:
  providing an audio filter at a predetermined sample rate including neighbouring sample points;
  increasing the sample rate of the audio filter to an increased sample rate including intermediate sample points between adjacent of the neighbouring sample points, the intermediate sample points being weighted by (i) nominating waveforms substantially representative of the audio filter at respective of the neighbouring sample points (ii) shifting each of the nominated waveforms in the time domain between the relevant neighbouring sample point and the intermediate sample point (iii) combining values for the shifted waveforms at the intermediate sample point to derive the weighting, and applying the weighting to the audio filter at respective of the intermediate sample points;
  providing another audio filter at the increased sample rate;
  combining the audio filter and the other audio filter to derive a composite audio filter at the increased sample rate;
  filtering the audio signal at the predetermined sample rate using the composite audio filter derived at the increased sample rate.

According to a second aspect of the invention there is provided a method of digitally filtering an audio signal, said method comprising the steps of:
  providing an audio filter at a predetermined sample rate including neighbouring sample points;
  increasing the sample rate of the audio filter to an increased sample rate including intermediate sample points between adjacent of the neighbouring sample points, the intermediate sample points being weighted by (i) providing a hypothetical waveform substantially representative of the audio filter and shifted in its time domain to align with the intermediate sample point (ii) expanding the shifted hypothetical waveform in the time domain (iii) combining values for the expanded hypothetical waveform at the neighbouring sample points to derive the weighting, and applying the weighting to the audio filter at respective of the intermediate sample points;
  providing another audio filter at the increased sample rate;
  combining the audio filter and the other audio filter to derive a composite audio filter at the increased sample rate;
  filtering the audio signal at the predetermined sample rate using the composite audio filter derived at the increased sample rate.

According to a third aspect of the invention there is provided a method of digitally filtering an audio signal, said method comprising the steps of:
  providing an audio filter at a predetermined sample rate including neighbouring sample points;
  increasing the sample rate of the audio filter to an increased sample rate including intermediate sample points between adjacent of the neighbouring sample points, the intermediate sample points being weighted by (i) providing a hypothetical waveform substantially representative of the audio filter and shifted in its time domain to align with the intermediate sample point (ii) determining values for the hypothetical waveform at the neighbouring sample points (iii) combining the values for the neighbouring sample points to derive the weighting, and applying the weighting to the audio filter at respective of the intermediate sample points;
  providing another audio filter at the increased sample rate;
  combining the audio filter and the other audio filter to derive a composite audio filter at the increased sample rate;
  filtering the audio signal at the predetermined sample rate using the composite audio filter derived at the increased sample rate.

According to a fourth of the invention there is provided a method of digitally filtering an audio signal, said method comprising the steps of:
  providing an audio filter at a predetermined sample rate including neighbouring sample points;
  increasing the sample rate of the audio filter to an increased sample rate including intermediate sample points between adjacent of the neighbouring sample points, the intermediate sample points being weighted by (i) nominating waveforms substantially representative of the audio filter at respective of the neighbouring sample points (ii) combining values for the nominated waveforms at the intermediate sample point to derive the weighting, and applying the weighting to the audio filter at respective of the intermediate sample points;

providing another audio filter at the increased sample rate;

combining the audio filter and the other audio filter to derive a composite audio filter at the increased sample rate;

filtering the audio signal at the predetermined sample rate using the composite audio filter derived at the increased sample rate.

Preferably the nominated waveforms are each shifted in the time domain substantially midway between the neighbouring sample point and the intermediate sample point.

Preferably the shifted hypothetical waveform is expanded in the time domain by a factor of substantially two (2).

Preferably the step of combining the audio filters is performed by convolution wherein the other audio filter includes one or more intermediate sample points between adjacent of its neighbouring sample points and wherein said convolution involves shifting the audio filter relative to the other audio filter where at least one of the neighbouring sample point of the audio filter corresponds with at least one of the intermediate sample points of the other audio filter.

Preferably weighting is applied across a predetermined number of said neighbouring sample points.

Preferably the composite audio filter is a combination of a bank of filters. More preferably the bank of filters together define a frequency bandwidth generally representative of the audio signal to be filtered.

Preferably the composite audio filter is a lowpass filter which approaches the Nyquist frequency.

Preferably the one or more waveforms each includes an impulse response produced by an impulse fed to respective of the audio filters. More preferably the method also comprises the step of applying an averaging curve to frequency components the impulse response. Still more preferably the averaging curve is adjusted to a width proportional to respective of the frequency components of the impulse response to which it is applied.

Preferably the impulse response is in the time domain represented by a sinc function. Alternatively the impulse response is in the time domain represented by a sine function of absolute time values.

According to a fifth aspect of the invention there is provided a computer or device-readable medium including instructions for digitally filtering an audio signal using a plurality of audio filters each of a predetermined sample rate, said instructions when executed by a processor cause said processor to:

provide an audio filter at a predetermined sample rate including neighbouring sample points;

increase the sample rate of the audio filter to an increased sample rate including intermediate sample points between adjacent of the neighbouring sample points, the intermediate sample points being weighted by (i) nominating waveforms substantially representative of the audio filter at respective of the neighbouring sample points (ii) shifting each of the nominated waveforms in the time domain between the relevant neighbouring sample point and the intermediate sample point (iii) combining values for the shifted waveforms at the intermediate sample point to derive the weighting, and applying the weighting to the audio filter at respective of the intermediate sample points;

provide another audio filter at the increased sample rate;

combine the audio filter and the other audio filter to derive a composite audio filter at the increased sample rate;

filter the audio signal at the predetermined sample rate using the composite audio filter derived at the increased sample rate.

According to a sixth aspect of the invention there is provided a computer or device-readable medium including instructions for digitally filtering an audio signal using a plurality of audio filters each of a predetermined sample rate, said instructions when executed by a processor cause said processor to:

provide an audio filter at a predetermined sample rate including neighbouring sample points;

increase the sample rate of the audio filter to an increased sample rate including intermediate sample points between adjacent of the neighbouring sample points, the intermediate sample points being weighted by (i) providing a hypothetical waveform substantially representative of the audio filter and shifted in its time domain to align with the intermediate sample point (ii) expanding the shifted hypothetical waveform in the time domain (iii) combining values for the expanded hypothetical waveform at the neighbouring sample points to derive the weighting, and applying the weighting to the audio filter at respective of the intermediate sample points;

provide another audio filter at the increased sample rate;

combine the audio filter and the other audio filter to derive a composite audio filter at the increased sample rate;

filter the audio signal at the predetermined sample rate using the composite audio filter derived at the increased sample rate.

According to a seventh aspect of the invention there is provided a computer or device-readable medium including instructions for digitally filtering an audio signal using a plurality of audio filters each of a predetermined sample rate, said instructions when executed by a processor cause said processor to:

increase the sample rate of the audio filter to an increased sample rate including intermediate sample points between adjacent of the neighbouring sample points, the intermediate sample points being weighted by (i) providing a hypothetical waveform substantially representative of the audio filter and shifted in its time domain to align with the intermediate sample point (ii) determining values for the hypothetical waveform at the neighbouring sample points (iii) combining values for the shifted waveforms at the neighbouring sample points to derive the weighting, and applying the weighting to the audio filter at respective of the intermediate sample points;

provide another audio filter at the increased sample rate;

combine the audio filter and the other audio filter to derive a composite audio filter at the increased sample rate;

filter the audio signal at the predetermined sample rate using the composite audio filter derived at the increased sample rate.

According to an eighth aspect of the invention there is provided a computer or device-readable medium including instructions for digitally filtering an audio signal using a plurality of audio filters each of a predetermined sample rate, said instructions when executed by a processor cause said processor to:

provide an audio filter at a predetermined sample rate including neighbouring sample points;

increase the sample rate of the audio filter to an increased sample rate including intermediate sample points between adjacent of the neighbouring sample points, the intermediate sample points being weighted by (i)

nominating waveforms substantially representative of the audio filter at respective of the neighbouring sample points (ii) combining values for the nominated waveforms at the intermediate sample point to derive the weighting, and applying the weighting to the audio signal of the filter at respective of the intermediate sample points;

provide another audio filter at the increased sample rate;

combine the audio filter and the other audio filter to derive a composite audio filter at the increased sample rate;

filter the audio signal at the predetermined sample rate using the composite audio filter derived at the increased sample rate.

According to a ninth aspect of the invention there is provided a system for digitally filtering an audio signal, the system comprising:

a plurality of audio filters each of a predetermined sample rate;

a processor configured to:
provide an audio filter at a predetermined sample rate including neighbouring sample points;
increase the sample rate of the audio filter to an increased sample rate including intermediate sample points between adjacent of the neighbouring sample points, the intermediate sample points being weighted by (i) nominating waveforms substantially representative of the audio filter at respective of the neighbouring sample points (ii) shifting each of the nominated waveforms in the time domain between the relevant neighbouring sample point and the intermediate sample point (iii) combining values for the shifted waveforms at the intermediate sample point to derive the weighting, and applying the weighting to the audio filter at respective of the intermediate sample points;
provide another audio filter at the increased sample rate;
combine the audio filter and the other audio filter to derive a composite audio filter at the increased sample rate;
filter the audio signal at the predetermined sample rate using the composite audio filter derived at the increased sample rate.

According to a tenth aspect of the invention there is provided a system for digitally filtering an audio signal, the system comprising:

a plurality of audio filters each of a predetermined sample rate;

a processor configured to:
provide an audio filter at a predetermined sample rate including neighbouring sample points;
increase the sample rate of the audio filter to an increased sample rate including intermediate sample points between adjacent of the neighbouring sample points, the intermediate sample points being weighted by (i) providing a hypothetical waveform substantially representative of the audio filter and shifted in its time domain to align with the intermediate sample point (ii) expanding the shifted hypothetical waveform in the time domain (iii) combining values for the expanded hypothetical waveform at the neighbouring sample points to derive the weighting, and applying the weighting to the audio filter at respective of the intermediate sample points;
provide another audio filter at the increased sample rate;
combine the audio filter and the other audio filter to derive a composite audio filter at the increased sample rate;
filter the audio signal at the predetermined sample rate using the composite audio filter derived at the increased sample rate.

According to an eleventh aspect of the invention there is provided a system for digitally filtering an audio signal, the system comprising:

a plurality of audio filters each of a predetermined sample rate;

a processor configured to:
increase the sample rate of the audio filter to an increased sample rate including intermediate sample points between adjacent of the neighbouring sample points, the intermediate sample points being weighted by (i) providing a hypothetical waveform substantially representative of the audio filter and shifted in its time domain to align with the intermediate sample point (ii) determining values for the hypothetical waveform at the neighbouring sample points (iii) combining values for the hypothetical waveform at the neighbouring sample points to derive the weighting, and applying the weighting to the audio filter at respective of the intermediate sample points;
provide another audio filter at the increased sample rate;
combine the audio filter and the other audio filter to derive a composite audio filter at the increased sample rate;
filter the audio signal at the predetermined sample rate using the composite audio filter derived at the increased sample rate.

According to a twelfth aspect of the invention there is provided a system for digitally filtering an audio signal, the system comprising:

a plurality of audio filters each of a predetermined sample rate;

a processor configured to:
provide an audio filter at a predetermined sample rate including neighbouring sample points;
increase the sample rate of the audio filter to an increased sample rate including intermediate sample points between adjacent of the neighbouring sample points, the intermediate sample points being weighted by (i) nominating waveforms substantially representative of the audio filter at respective of the neighbouring sample points (ii) combining values for the nominated waveforms at the intermediate sample point to derive the weighting, and applying the weighting to the audio filter at respective of the intermediate sample points;
provide another audio filter at the increased sample rate;
combine the audio filter and the other audio filter to derive a composite audio filter at the increased sample rate;
filter the audio signal at the predetermined sample rate using the composite audio filter derived at the increased sample rate.

According to a thirteen aspect of the invention there is provided a method of digitally filtering an image, said method comprising the steps of:
providing an image filter at a predetermined sample rate including neighbouring sample points;

increasing the sample rate of the image filter to an increased sample rate including intermediate sample points between adjacent of the neighbouring sample points, the intermediate sample points being weighted according to the influence of the neighbouring sample points;

providing another image filter at the increased sample rate;

calculating the weighting for each of the intermediate sample points based on one or more waveforms substantially representative of the image filter;

applying the weighting to the image filter at respective of the intermediate sample points;

combining the image filter and the other image filter to derive a composite image filter at the increased sample rate;

filtering the image at the predetermined sample rate using the composite image filter derived at the increased sample rate.

Preferably the image includes a matrix of pixels to which the composite image filter is applied.

BRIEF DESCRIPTION OF DRAWINGS

In order to achieve a better understanding of the nature of the present invention an embodiment of a method of digitally filtering an audio signal will now be described, by way of example only, with reference to the accompanying drawings in which.

DESCRIPTION OF EMBODIMENTS

The present invention in a preferred embodiment is directed to a method of digitally filtering an audio signal at a predetermined sample rate by applying a composite audio filter derived at an increased sample rate. The composite audio filter is obtained by combining one audio filter with another audio filter at the increased sample rate. In this embodiment the sample rates of the audio filters may be increased from their predetermined to the increased sample rate by various techniques which involve weighting intermediate sample points.

Figure 1:
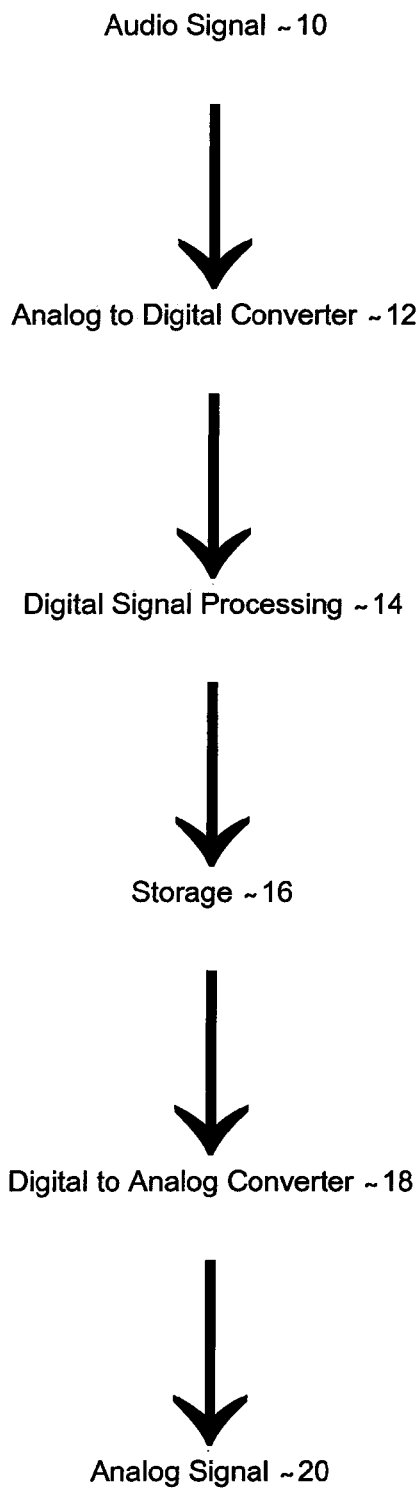
FIG. 1 is a schematic of application of embodiments of the invention in digital audio recording and playback.

FIG. 1 shows application of the various embodiments of the present disclosure in the course of digital audio recording and playback. The analog audio signal 10 is converted to a digital audio signal at an analog to digital converter (ADC) 12. The digital audio signal may then be subject to signal processing at digital processor 14, for example in audio equalisation (EQ). The processed digital signal is downsampled and stored at storage memory 16 before a sample rate increase to increase its resolution prior to playback. The relatively high resolution digital audio signal is then converted back to an analog signal 20 at a digital to analog converter (DAC) 18.

It will be understood that the various embodiments of the present disclosure can be applied:

i) at the ADC 12 where the digital audio signal undergoes a sample rate increase or over-sampling, which in some embodiments may be performed with weighting;

ii) at the digital signal processor 14 or a digital filter associated with EQ where, for example, the digital signal is filtered with a lowpass filter or bandpass filter;

iii) downstream of the storage memory 16 where the filtered audio signal undergoes a sample rate increase or up-sampling prior to playback.

Some embodiments of the present disclosure may be embodied in computer program code or software. The digital filter of the digital signal processor 14 is represented by a particular frequency response. The particular frequency response is generally dependent on the impulse response of the filter which is characterised by the software or techniques of the various embodiment of this invention. The present embodiment may cover the basic types of frequency response by which digital filters are classified including lowpass, highpass, bandpass and bandreject or notch filters. The digital filters are broadly categorised as Finite Impulse Response (FIR) or Infinite Impulse Response (IIR) filters.

In order to understand this embodiment of audio filtering with a virtual sample rate increase the composite audio filter is for simplicity derived from two (2) audio filters although it will be appreciated that any number of filters may be used. The composite audio filter generally includes a bank of the filters. The bank of filters together define a frequency bandwidth representative of the audio signal or spectrum to be filtered. In this embodiment an impulse response is produced by an impulse fed to the respective filter. The impulse response for each of the filters may be represented by a sinc function according to the equation:

$$\frac{e^{-(qx)^2}\sin[2\pi x/lpf]}{2\pi x} \qquad \text{Equation 1}$$

where lpf is the corner frequency for the lowpass filter, x is the time variable on the x-axis, and $e^{-(qx)^2}$ represents an averaging curve with q representing the aspect ratio of the averaging curve. It is to be understood that the sinc function is the sum of cos components.

Figure 2:
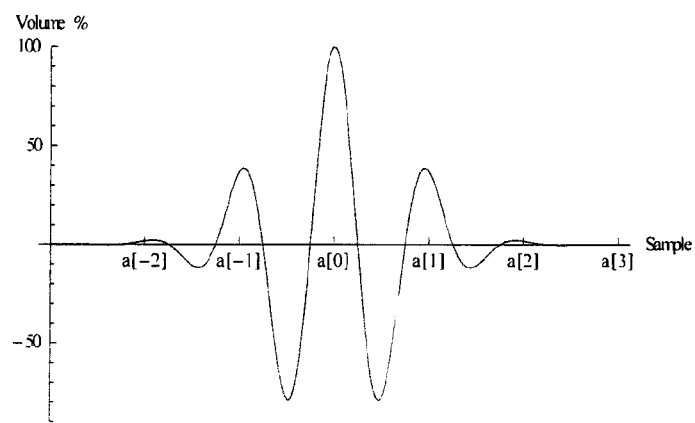
FIG. 2 is an impulse response of an audio filter of an embodiment of the invention.

FIG. 2 illustrates the impulse response of equation 1. It is to be understood that a[0] is the instance at which the impulse occurs and a[n] designates neighbouring sample points for the impulse response where n is the number of the sample point at the predetermined sample rate. In this embodiment the predetermined sample rate is 44.1 kHz (samples per second) although it will be appreciated that any other sample rate may be used depending on the application.

Figure 3:
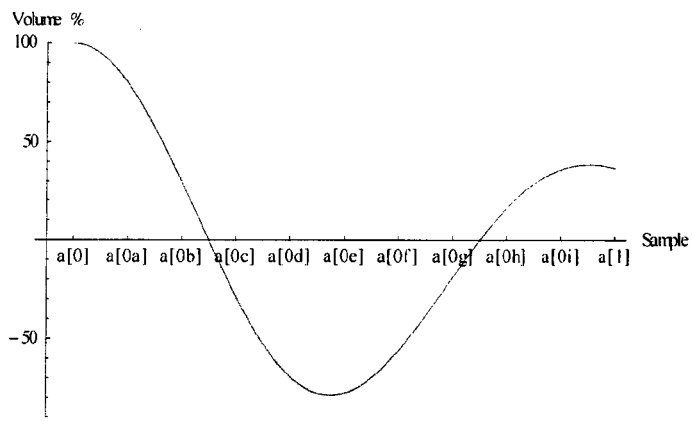
FIG. 3 is an enlarged view of the impulse response of FIG. 2 with an increased sample rate.

FIG. 3 illustrates an enlarged view of the impulse response of FIG. 2 with a sample rate increase to the increased sample rate. For illustrative purposes only the predetermined sample rate is increased by a factor of ten (10) with nine (9) intermediate and equally spaced sample points designated a[0a] to a[0i] located between neighbouring sample points such as a[0] and a[1]. In some embodiments, the predetermined sample rate may in practice be increased by a factor of up to 1,000 where the increased sample rate is 44,100 kHz.

In this embodiment the filters are combined by convolution to obtain one of the composite audio filters. This convolution of impulse responses a and b is represented by an array of samples which can also be mathematically defined by the equation:

$$\sum_{n=0}^{N-1} a[n] \times b[k-n] \qquad \text{Equation 2}$$

where N is the number of samples for each of impulse responses a and b, and k is from 0 to N−1 for each of the samples for impulse response b. The array of samples thus includes 2N−1 rows and columns. The sum of the sample values for each row of the array represents the composite audio filter. It is also possible that the composite audio filter is represented mathematically by integrating the impulse responses across an infinite number of samples.

Figure 4:
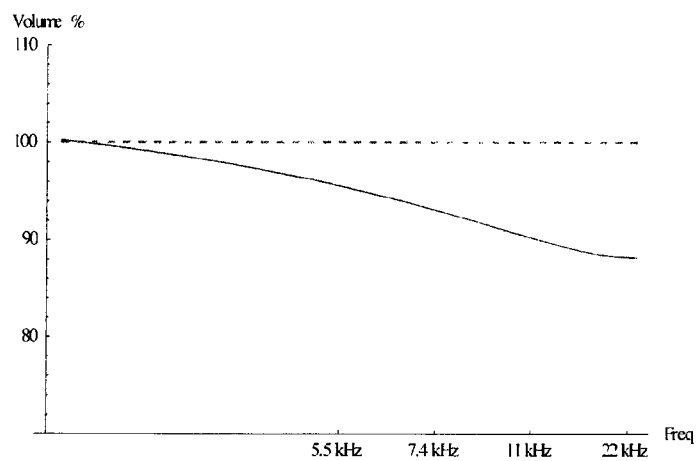
FIG. 4 is a frequency response of a composite audio filter according to an embodiment of the invention compared with frequency response of a conventional filter (shown in broken line detail)

The composite audio filter is in this example a lowpass filter which approaches the Nyquist frequency. The Nyquist frequencies and above are substantially removed in performing the sample rate increase on the various impulse responses. The composite filter or other composite filters may also function as bandpass or bandreject filter depending on the application. FIG. 4 illustrates a frequency response for the composite audio filter of this embodiment together with a frequency response of a conventional audio filter with no sample rate increase (shown in broken line detail). It can be seen that the frequency response of the composite filter of this embodiment provides a curve with a corner frequency as it approaches the Nyquist frequency whereas the frequency response of the conventional filter is flat with no effect.

Figure 5:
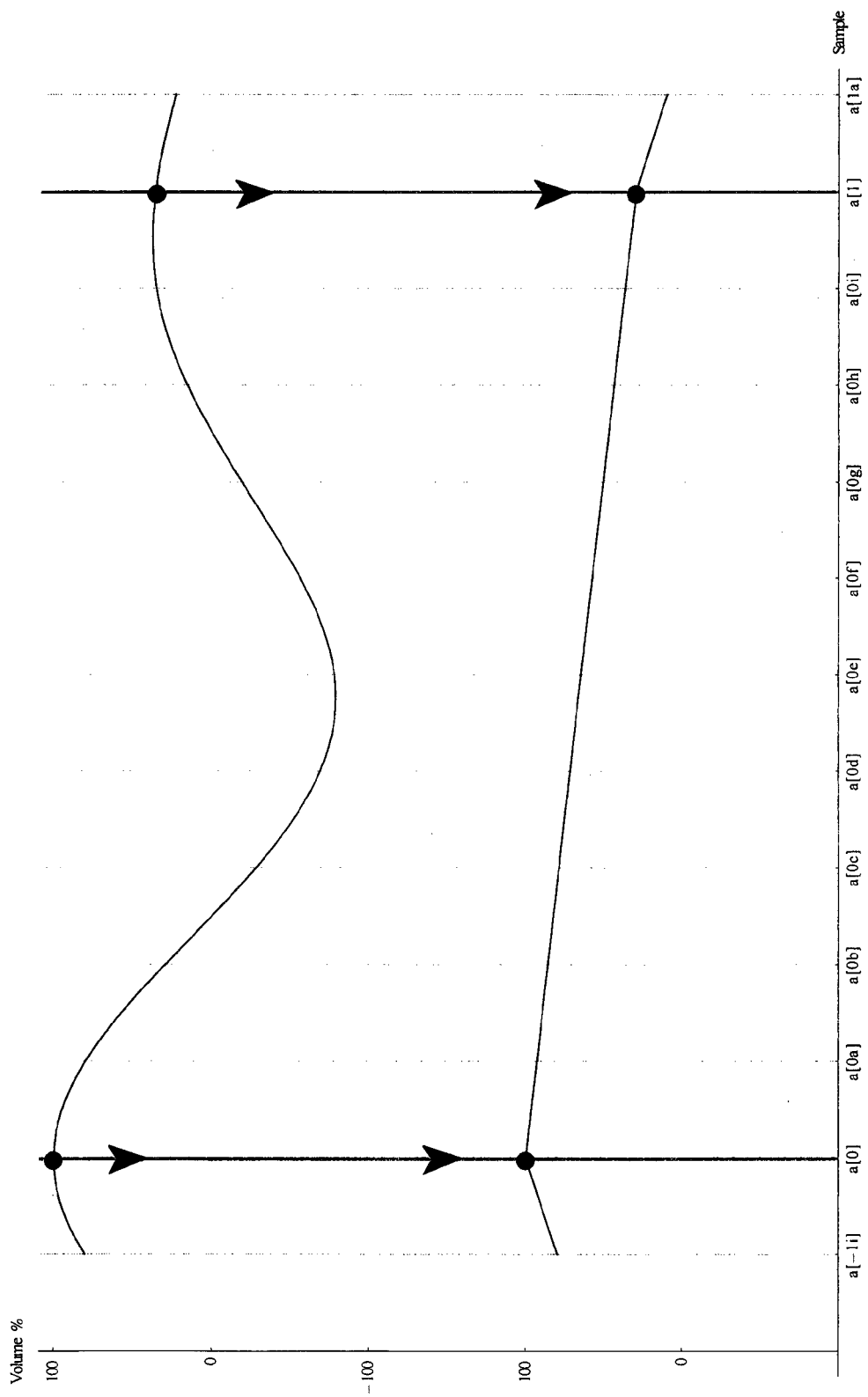
FIG. 5 is a schematic of returning the sample rate to the predetermined rate for the composite audio filter.

The composite audio filter is "constructed" with the benefit of increased accuracy at the increased sample rate. As shown in FIG. 5 the composite audio filter is returned to the predetermined sample rate prior to filtering the audio signal. The composite filter is thus applied to the audio at the predetermined sample rate with a virtual sample rate increase which is less demanding in terms of processor power.

In some embodiments, the sample rate increase on each of the audio filters may be performed by the following two techniques involving:

1. Shifted neighbouring audio signals; and/or
2. Expanded hypothetical impulse response.

Figure 6:
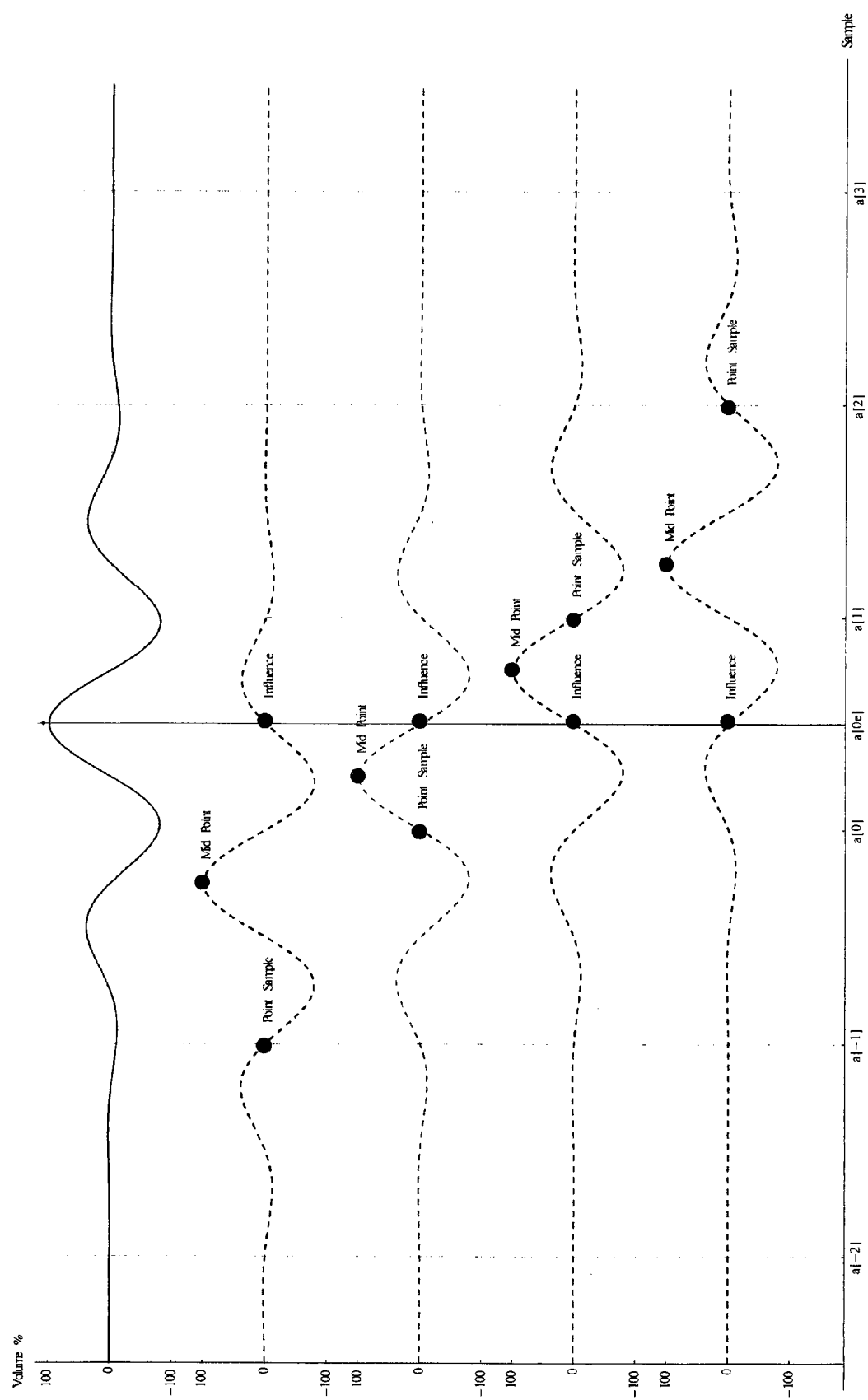
FIG. 6 is a schematic of one technique for increasing the sample rate of the filter.

In weighting values of the impulse response using the shifted neighbouring audio signals, neighbouring impulse responses are nominated from either side of the intermediate sample point to be determined. Each of the nominated neighbouring samples is then shifted in the time domain substantially midway between the neighbouring sample point and the intermediate sample point. In this example the relevant weighting is calculated by summing values which each of the shifted neighbouring impulse responses contribute at the relevant intermediate sample point. This technique is schematically illustrated in FIG. 6. The weighting may be applied across a predetermined number of the neighbouring sample points, for example 1,024 sample points.

Figure 7:
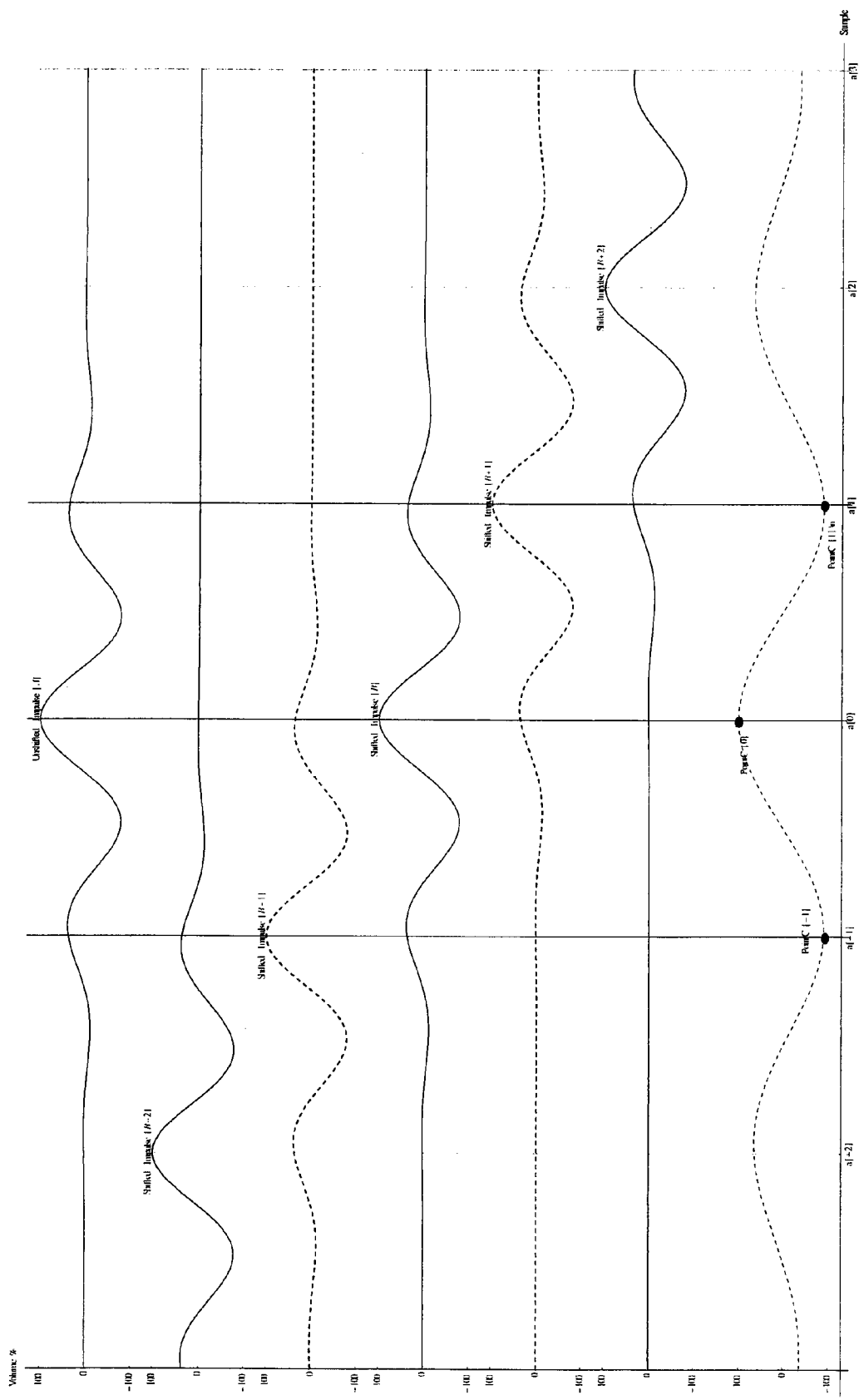
FIG. 7 is a schematic of one technique for adjusting the sampling rate according to an embodiment of the invention.

In using this weighting technique, combining of the audio filters is performed at the adjusted sampling rate so that neighbouring sample points for the audio filter align or correspond with at least each of the intervening sample points of the other audio filter to which it is applied. This involves shifting the audio filter at the adjusted sampling rate relative to the other audio filter. For example, if the other audio filter includes intervening sample points located substantially midway between adjacent of its neighbouring sample points, the adjusted sampling rate for applying the filters to one another is substantially half the predetermined sample rate. FIG. 7 schematically illustrates this technique for adjusting the sampling rate.

The sampling rate is adjusted in this embodiment by convolving every other impulse response. This means the uppermost impulse response of FIG. 7 is convolved with the three (3) impulse responses shown in solid line detail and the other impulse responses shown in broken line detail are effectively ignored. The resulting or composite audio filter is the lowermost impulse response of FIG. 7 shown in broken line detail and can in this example be represented by the following equations.

New Convolved $PointC[-1]$      Equations 3

$$\text{is} \sum_{-\infty}^{\infty} \text{Impulse}[A] * \text{Impulse}[B-2]$$

New Convolved $PointC[0]$ is $\sum_{-\infty}^{\infty} \text{Impulse}[A] * \text{Impulse}[B]$ New Convolved $PointC[1]$ $$\text{is} \sum_{-\infty}^{\infty} \text{Impulse}[A] * \text{Impulse}[B+2]$$

For a predetermined sample rate of 44.1 kHz the adjusted sampling rate in this example is 22.05 kHz. If the other audio filter includes nine (9) intervening sample points between adjacent of its neighbouring sample points the adjusted sampling rate will be one tenth of the predetermined sample rate. This equates to an adjusted sampling rate of 4.41 kHz for a predetermined sample rate of 44.1 kHz. It is understood that adjusting the sampling rate "corrects" for shifting of the nominated neighbouring sample points in calculating weightings for each of the intermediate sample points. The shift in the nominated neighbouring samples in the time domain is generally proportional to the adjustment in the sampling rate in convolving the audio filters. Thus, a shift in the nominated neighbouring samples midway between neighbouring sample point and the intermediate sample point means an adjustment in the sampling rate by a factor of one-half.

Figure 8:
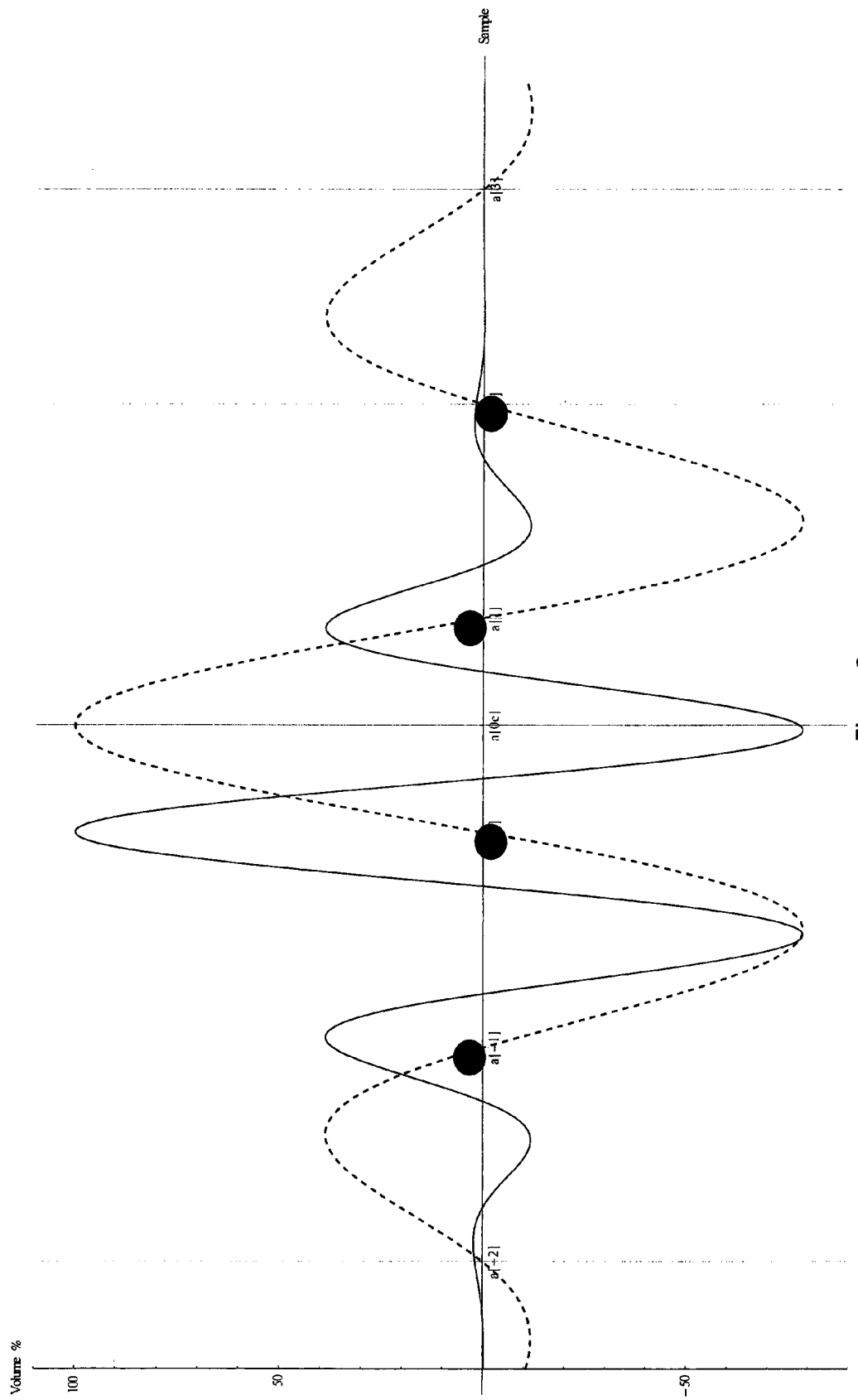
FIG. 8 is a schematic of another technique for increasing the sample rate of the filter.

In weighting values of the impulse response using the expanded hypothetical impulse response, the relevant impulse response is effectively replicated as a hypothetical impulse response with its time domain shifted to align with the intermediate sample point to be determined. In some embodiments, the hypothetical and shifted impulse response is expanded in its time domain by factor of substantially 2. In this example the relevant weighting is calculated by summing values for the expanded impulse response at the neighbouring sample points. This technique is schematically illustrated in FIG. 8. The weighting may be applied across a predetermined number of the neighbouring sample points, for example 1,024 sample points.

In some embodiments, the sample rate increase on each of the audio filters may alternatively be performed by using the following two (2) techniques involving i) a hypothetical audio signal, and/or ii) neighbouring audio signals.

Figure 9:
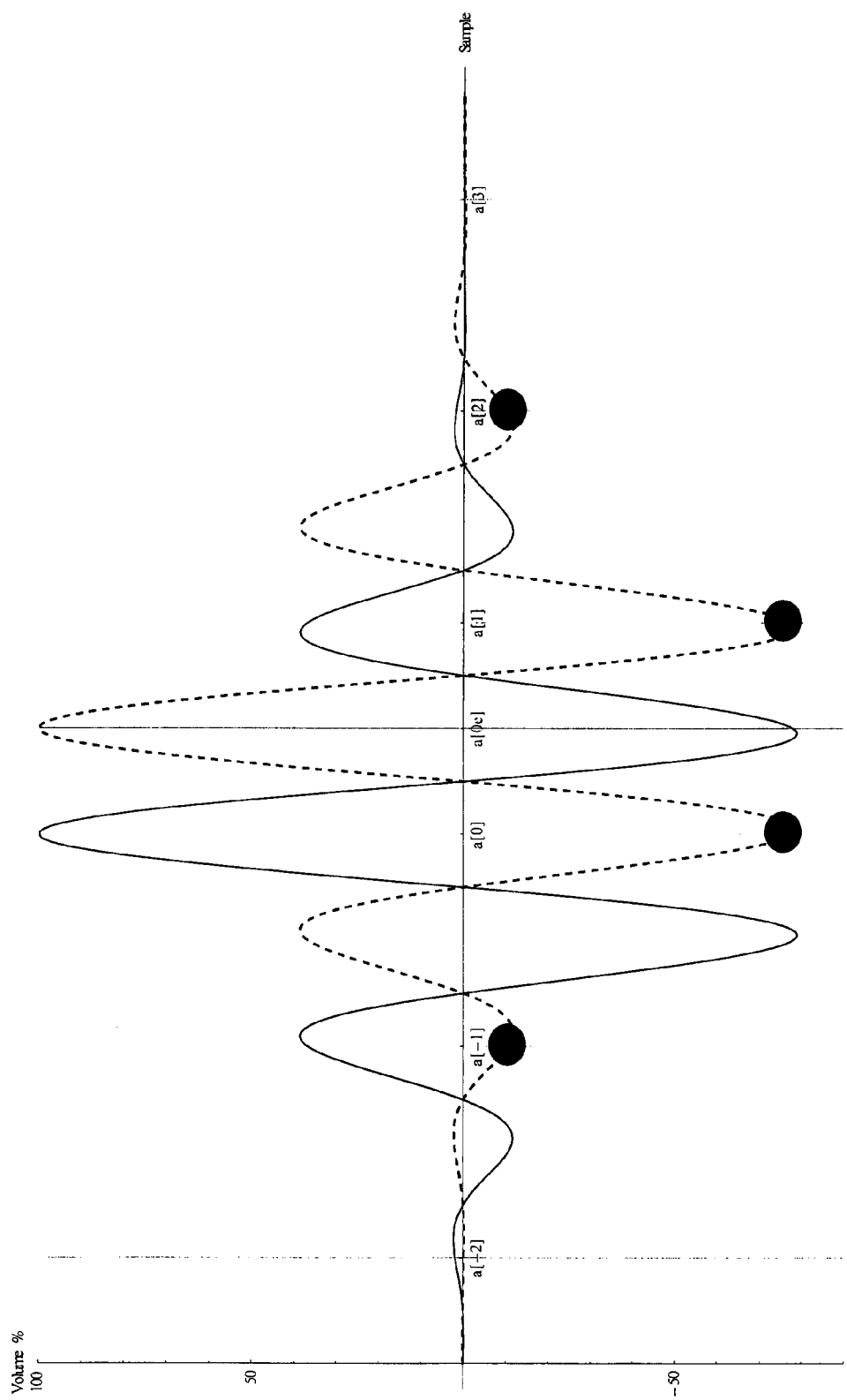
FIG. 9 is a schematic of an alternative technique for increasing the sample rate of an impulse response.

In weighting values of the impulse response using the hypothetical audio signal, the relevant impulse response is effectively replicated with its time domain shifted to align with the intermediate sample point to be determined. The weighting is calculated by summing values for the hypothetical audio signal at the neighbouring sample points and the weighting is a factor inversely proportional to the sum of these values. The relevant weighting or factor is applied to the impulse response of the filter at respective of the intermediate sample points. This technique is schematically illustrated in FIG. 9. The weighting may be calculated across a predetermined number of the neighbouring sample points. In this embodiment the following equation provides for weighting of values for each of the intermediate sample points where 1024 neighbouring sample points are taken into account:

$$\sum_{n=-512}^{n=512} \frac{e^{-q^2\left(\frac{1^2}{20}\right)} \mathrm{Sin}\left[lpf\pi\frac{n}{20}\right]}{\pi\frac{n}{20}512} \quad \text{Equation 4}$$

where n is the sample number, q represents the aspect ratio of the averaging curve, and lpf is the corner frequency for the lowpass filter.

Figure 10:
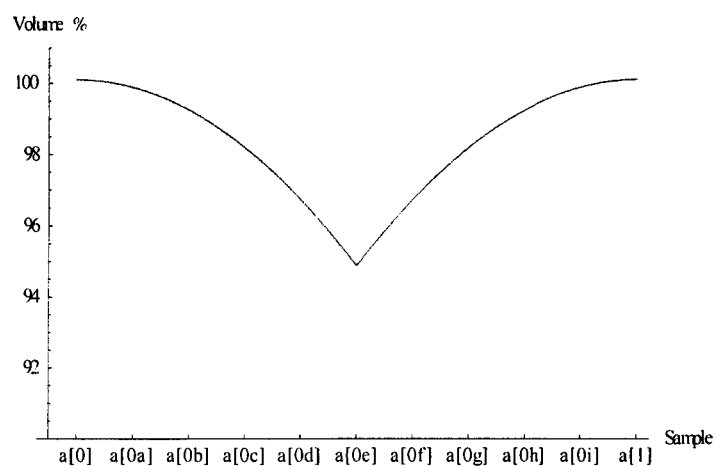
FIG. 10 is a graph depicting weightings for intermediate sample points to be applied to relevant audio values.

FIG. 10 illustrates the weightings for each of the intermediate sample points a[0a] to a[0i] to be applied to the value of the relevant impulse response.

Figure 11:
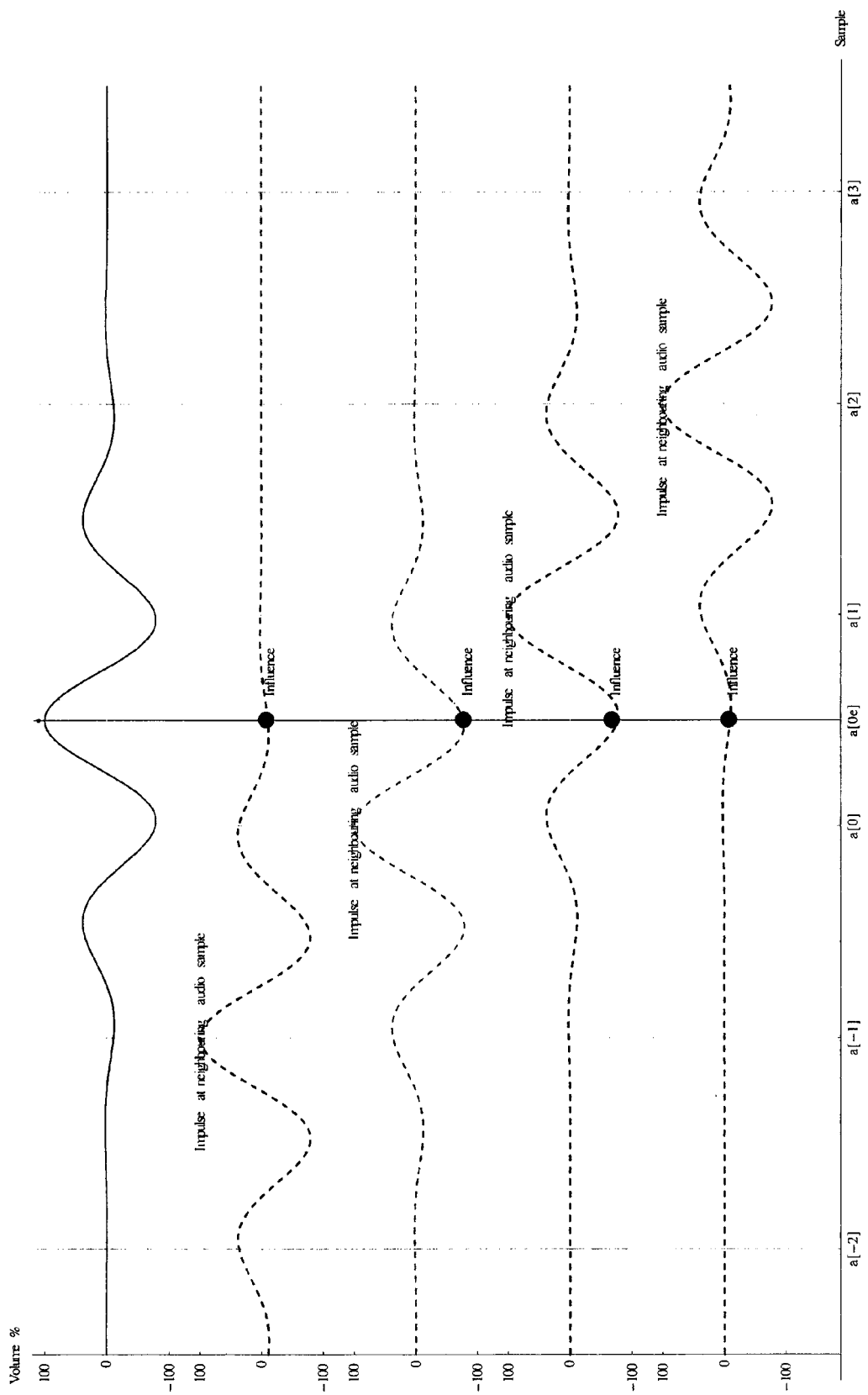
FIG. 11 is a schematic of another alternative technique for increasing the sample rate of an impulse response.

In weighting values of the impulse response using the neighbouring audio signals, neighbouring impulse responses are nominated from either side of the intermediate sample point to be determined. In this example the relevant weighting is calculated by summing values which each of the nominated neighbouring impulse responses contribute at the relevant intermediate sample point. This technique is schematically illustrated in FIG. 11. The weighting may be applied across a predetermined number of the neighbouring sample points, for example 1024 sample points.

Figure 12:
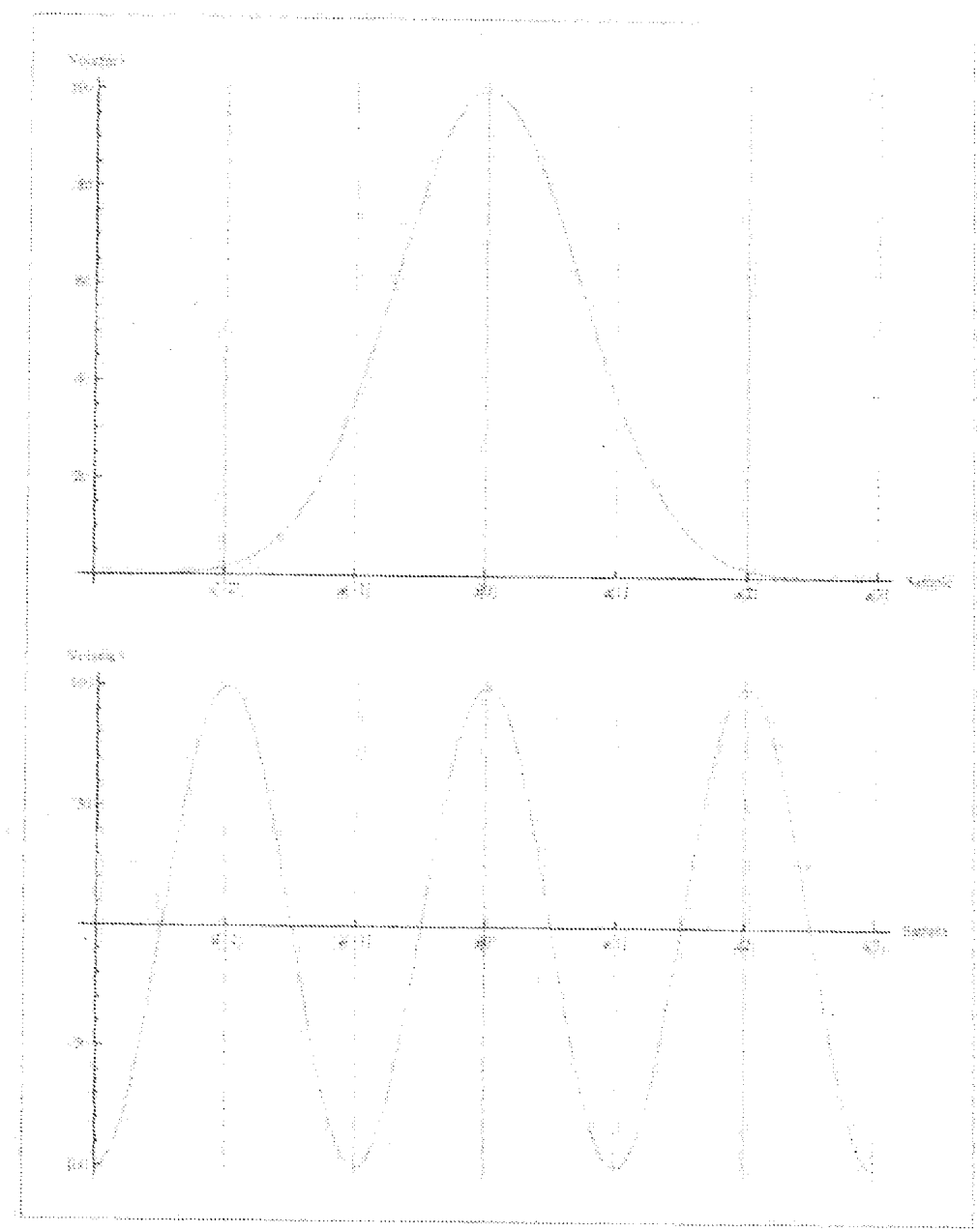
FIGS. 12 and 13 illustrate averaging curves applied to respective impulse responses according to an embodiment of the invention.
Figure 13:
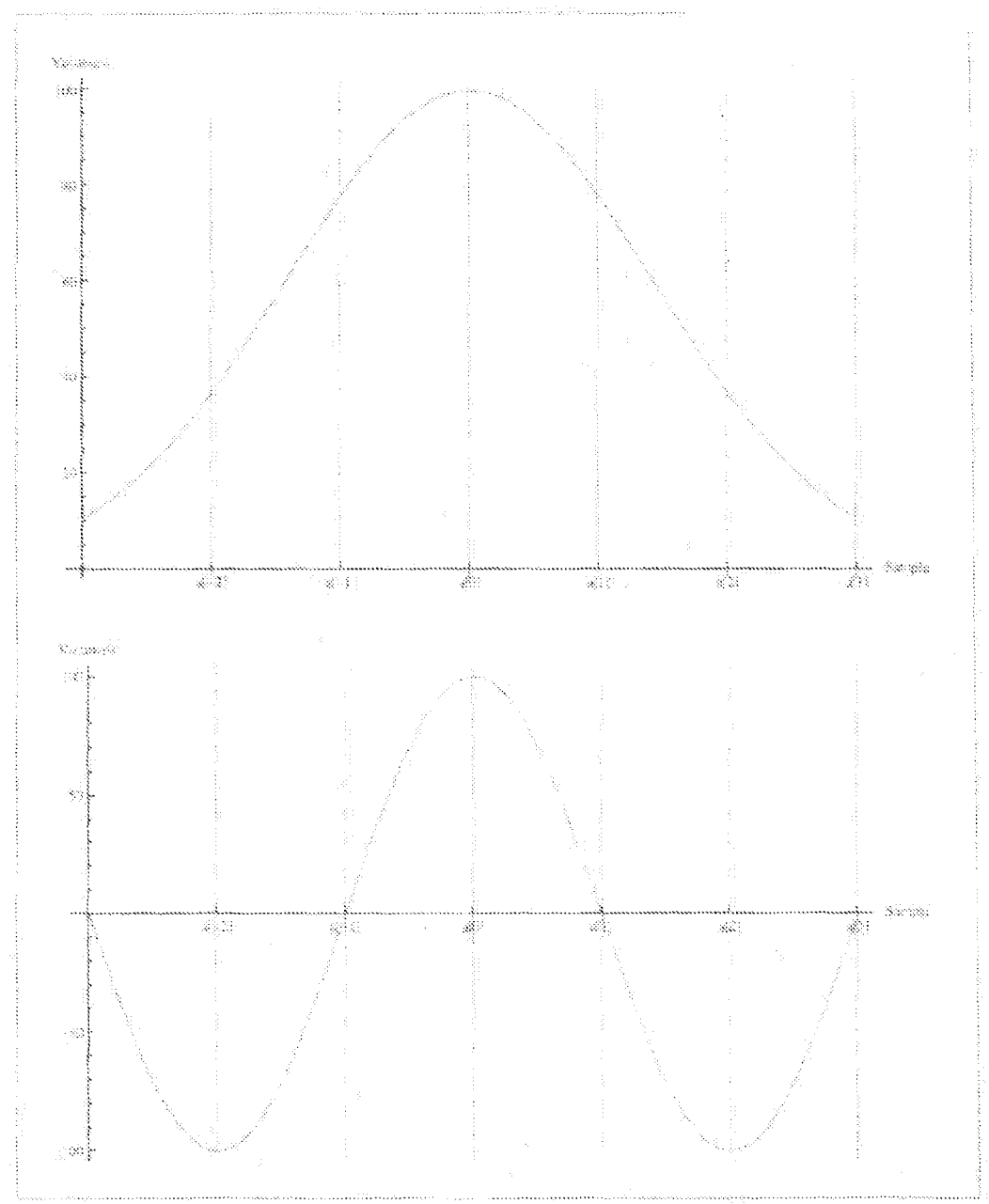
Figure 14:
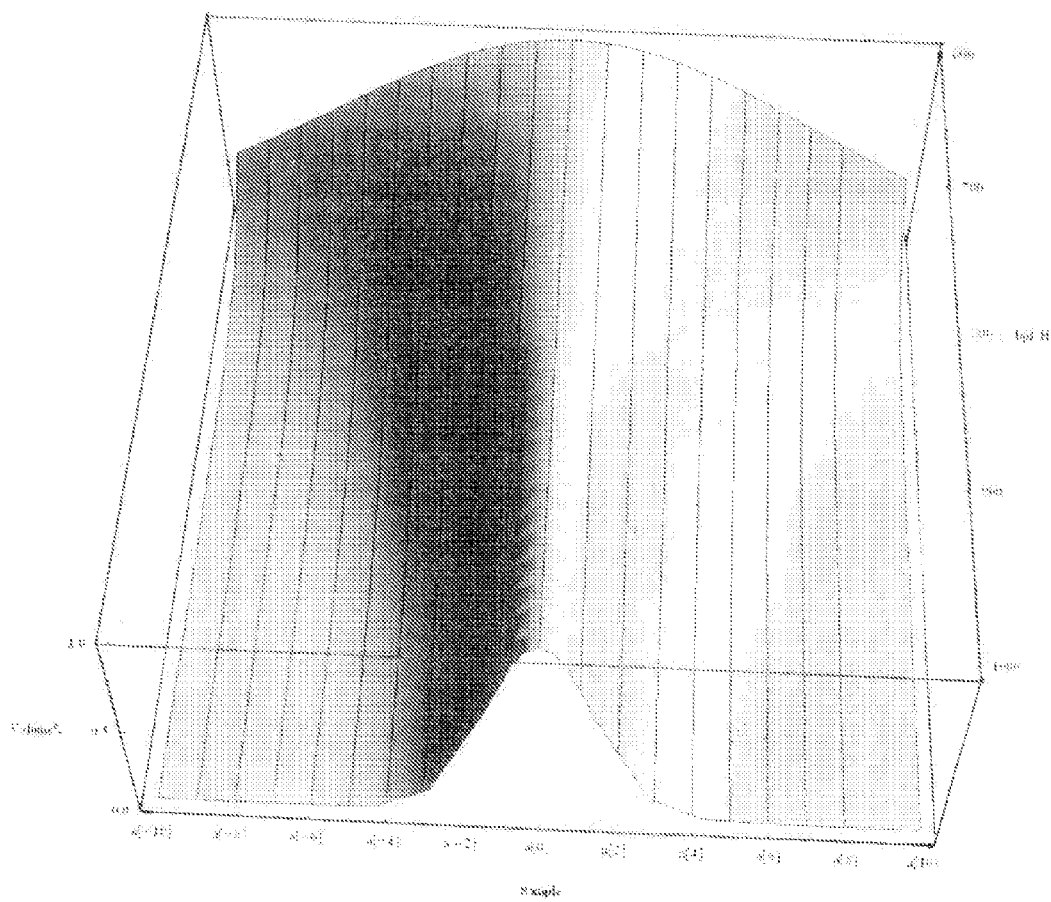
FIG. 14 is a graph depicting averaging curves of different widths as a function of the frequency of the impulse response.

In another embodiment the averaging curve applied to the impulse response may be adjusted to a width proportional to the frequency of the impulse response to which it is applied. FIG. 12 illustrates an averaging curve having a width of around four (4) samples applied to an impulse response having a relatively high frequency. FIG. 13 shows an adjusted averaging curve having a width of around eight (8) samples applied to another impulse response having a relatively low frequency. It can be seen that in both cases the width or q of the averaging curve is substantially proportional to the frequency of the corresponding impulse response. This is schematically shown in FIG. 14 where the width of the averaging curve increases in the z-axis with decreasing frequency in the impulse response.

In another aspect of the invention an audio filter is provided at an increased sample rate and applied to an audio signal at its predetermined sample rate. The sample rate increase on the audio filter is provided using any one of the weighting techniques described wherein the intermediate sample points are weighted according to the influence of the neighbouring sample points.

Now that several embodiments of the present disclosure have been described it will be apparent to those skilled in the art that the method of digitally filtering an audio signal has at least the following advantages over the prior art:
1. The composite audio filter is derived at the increased sample rate which provides a relatively "smooth" filter in its frequency response;
2. The composite filter provides improved filtering in for example EQ;
3. The composite filter "design" is akin to analog insofar as it is "constructed" from filters at significantly increased sample rates;
4. The composite audio filter substantially reduces unwanted resonants inherent in analog and prior digital filters;
5. It provides a frequency response which is smoother and in this respect more akin to an analog filter;
6. The composite filter is applied to the relevant audio at relatively high resolution without requiring a sample rate increase.

Those skilled in the art will appreciate that the invention described herein is susceptible to variations and modifications other than those specifically described. For example, the impulse response may be of practically any waveform. If represented by a mathematical equation, the impulse response is not limited to a sinc function but includes other waveforms such as:
i) a sine function of absolute values represented in the time domain;
ii) a sine function shifted substantially one-quarter of its cycle;
iii) a sine function of values from zero (0) to positive infinity only;
iv) a sinc function (sum of cosine components) for positive values only.

The processing of audio signals need not be limited to acoustics but extends to other sound applications including ultrasound and sonar. The invention also extends beyond audio signals to other signals including signals derived from a physical displacement such as that obtained from measurement devices, for example a strain gauge or other transducer which generally converts displacement into an electronic signal. The invention also covers digital filtering of signals associated with digital communications.

The invention in another embodiment is applied to imaging and image filters where, for example, the matrix of pixels in an image is filtered with a composite image filter. In some embodiments, the composite image filter is obtained by combining two (2) or more image filters at an increased sample rate. In increasing the sample rate to include intermediate sample points, these intermediate points are weighted depending on the influence of neighbouring sample points.

All such variations and modifications are to be considered within the scope of the present invention the nature of which is to be determined from the foregoing description.

The invention claimed is:

1. A method of digitally filtering an audio signal, said method comprising the steps of:
   providing an audio filter represented by an impulse response of said filter, said impulse response including a waveform represented by a mathematical function in the time domain, the impulse response including a plurality of neighbouring sample points;

increasing the sample rate of the impulse response of the audio filter to an increased sample rate by introducing intermediate sample points between adjacent of the neighbouring sample points of the impulse response;

determining a weighting for each of the intermediate sample points by (i) nominating waveforms representative of the impulse response of the audio filter at respective of the neighbouring sample points (ii) shifting each of the nominated waveforms in the time domain between the relevant neighbouring sample point and the intermediate sample point (iii) combining values for the shifted waveforms at the intermediate sample point to derive the weighting; and applying the weighting to the impulse response of the audio filter at respective of the intermediate sample points;

providing another audio filter;

combining the audio filter and the other audio filter to derive a composite audio filter;

filtering the audio signal using the composite audio filter.

2. A method as defined in claim 1 wherein the nominated waveforms are each shifted in the time domain midway between the relevant neighbouring sample point and the intermediate sample point.

3. A method as defined in claim 1 wherein the step of combining the audio filters is performed by convolution of the impulse responses of the respective audio filters.

4. A method as defined in claim 1 wherein the weighting is applied across a predetermined number of said neighbouring sample points.

5. A method as defined in claim 1 wherein the composite audio filter is a combination of a bank of filters.

6. A method as defined in claim 5 wherein the bank of filters together define a frequency bandwidth generally representative of the audio signal to be filtered.

7. A method as defined in claim 1 wherein the composite audio filter is a lowpass filter which approaches the Nyquist frequency, wherein Nyqyuist frequencies and above are removed from the impulse response of each of said filters on introducing the intermediate sample points.

8. A method as defined in claim 1 also comprising the step of applying an averaging curve derived from a time-domain exponential factor to the waveform of the impulse response representing respective of the audio filters.

9. A method as defined in claim 8 wherein the averaging curve is adjusted to a width inversely proportional to the frequency of the waveform of the impulse response representing the audio filter to which it is applied.

10. A method as defined in claim 1 wherein the impulse response is in the time domain represented by a sine function.

11. A method as defined in claim 1 wherein the impulse response is in the time domain represented by a sine function of absolute values.

12. A non-transitory computer or device-readable medium including instructions for digitally filtering an audio signal using a plurality of audio filters each represented by an impulse response of said filter, said impulse response including a waveform represented by a mathematical function in the time domain, the impulse response including a plurality of neighbouring sample points, said instructions when executed by a processor cause said processor to:

provide an audio filter;

increase the sample rate of the impulse response of the audio filter to an increased sample rate by introducing intermediate sample points between adjacent of the neighbouring sample points of the impulse response;

determine a weighting for each of the intermediate sample points by (i) nominating waveforms representative of the impulse response of the audio filter at respective of the neighbouring sample points (ii) shifting each of the nominated waveforms in the time domain between the relevant neighbouring sample point and the intermediate sample point (iii) combining values for the shifted waveforms at the intermediate sample point to derive the weighting;

apply the weighting to the impulse response of the audio filter at respective of the intermediate sample points;

provide another of the audio filters;

combine the audio filter and the other audio filter to derive a composite audio filter;

filter the audio signal using the composite audio filter.

* * * * *